US008466755B2

(12) United States Patent
Hara

(10) Patent No.: US 8,466,755 B2
(45) Date of Patent: Jun. 18, 2013

(54) POLAR MODULATION APPARATUS AND COMMUNICATION DEVICE

(75) Inventor: Yoshihiro Hara, Osaka (JP)

(73) Assignee: Panasonic Corporation, Osaka (JP)

( * ) Notice: Subject to any disclaimer, the term of this patent is extended or adjusted under 35 U.S.C. 154(b) by 229 days.

(21) Appl. No.: 13/142,489

(22) PCT Filed: Nov. 20, 2009

(86) PCT No.: PCT/JP2009/006272
§ 371 (c)(1),
(2), (4) Date: Jun. 28, 2011

(87) PCT Pub. No.: WO2010/076845
PCT Pub. Date: Jul. 8, 2010

(65) Prior Publication Data
US 2011/0267990 A1 Nov. 3, 2011

(30) Foreign Application Priority Data

Jan. 5, 2009 (JP) ................................. 2009-000431

(51) Int. Cl.
*H03C 3/38* (2006.01)
(52) U.S. Cl.
USPC ........... 332/145; 332/144; 330/127; 330/133; 330/135; 330/291; 330/296; 375/297; 455/102
(58) Field of Classification Search
USPC .......... 330/127, 133, 135, 291, 296; 455/102; 332/144, 145; 375/297
See application file for complete search history.

(56) References Cited

U.S. PATENT DOCUMENTS

| 6,256,482 B1 | 7/2001 | Raab |
| 7,109,791 B1 | 9/2006 | Epperson et al. |
| 7,499,502 B2 * | 3/2009 | Morimoto et al. ............ 375/297 |
| 7,783,269 B2 * | 8/2010 | Vinayak et al. ............... 455/126 |
| 2005/0146379 A1 | 7/2005 | Sugiyama et al. |
| 2008/0031384 A1 | 2/2008 | Hara et al. |

FOREIGN PATENT DOCUMENTS

| JP | 2005-223877 | 8/2005 |
| JP | 2008-61231 | 3/2008 |

OTHER PUBLICATIONS

International Search Report issued Dec. 15, 2009 in corresponding International Application No. PCT/JP2009/006272.
English translation of Informal Comments filed in response to the Written Opinion issued Dec. 15, 2009 in corresponding International Application No. PCT/JP2009/006272.

* cited by examiner

*Primary Examiner* — Arnold Kinkead
(74) *Attorney, Agent, or Firm* — Wenderoth, Lind & Ponack, L.L.P.

(57) ABSTRACT

Provided is a Polar modulation apparatus which compensates for output characteristics of a power amplifier. A data generator generates an amplitude component signal and a phase component signal. A phase modulator generates a phase modulated signal obtained by phase modulating the phase component signal. An adder adds an amplitude offset voltage to the amplitude component signal. A power amplifier which includes a first hetero-junction bipolar transistor, amplifies the phase modulated signal by using the amplitude component signal. A monitor unit monitors the power amplifier and outputs a monitor voltage. The control unit calculates the amplitude offset voltage according to the monitor voltage and outputs the calculated amplitude offset voltage to the adder. The monitor unit includes a second hetero-junction bipolar transistor and outputs a collector emitter voltage of the second hetero-junction bipolar transistor as the monitor voltage.

11 Claims, 14 Drawing Sheets

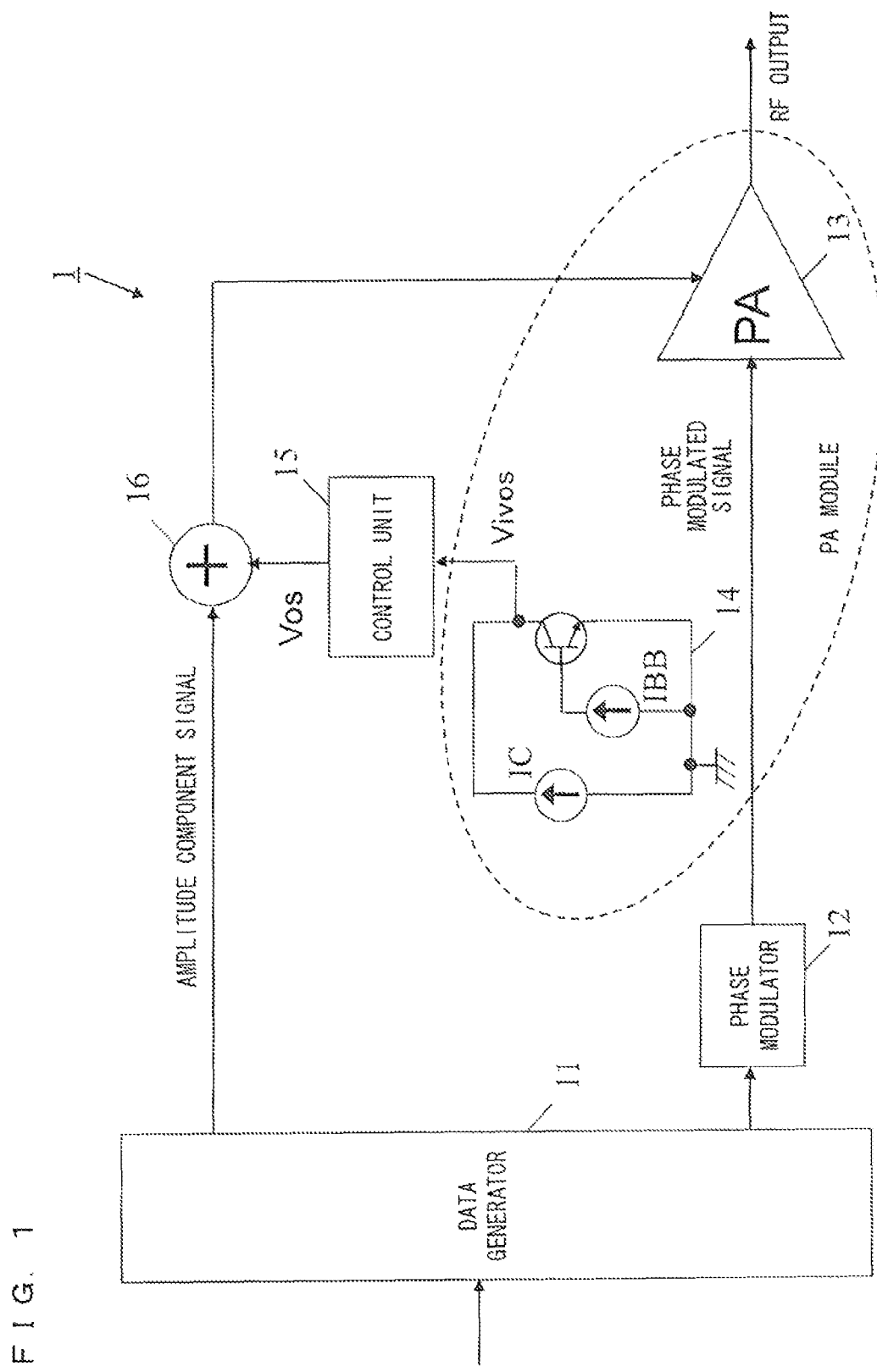
F I G. 1

FIG. 11

| Vivos | Vos |
|---|---|
| Vivos1 | Vos1 |
| Vivos2 | Vos2 |
| Vivos3 | Vos3 |
| Vivos4 | Vos4 |
| Vivos5 | Vos5 |

17

POLAR MODULATION APPARATUS AND COMMUNICATION DEVICE

TECHNICAL FIELD

The present invention relates to a polar modulation apparatus for use in communication devices such as mobile phones and wireless LAN devices, and more particularly, a polar modulation apparatus operable at high efficiency, achieving high linearity, and a communication device using the same.

BACKGROUND ART

In recent years, there has been interest in the polar modulation method as a technology for achieving both high linearity and high efficiency in a transmit modulator (e.g., see Patent Literature 1). FIG. 15 is a diagram showing an exemplary configuration of a transmit modulator using a conventional polar modulation method (hereinafter, referred to as a polar modulation apparatus). In FIG. 15, the conventional polar modulation apparatus includes a power amplifier (PA) 51, which amplifies a phase modulated signal, and a power supply control unit 52, which controls a power supply voltage of the power amplifier 51, based on an amplitude component signal. The phase modulated signal is input to the power amplifier 51. The amplitude component signal is input to the power supply control unit 52. As described above, the employment of the polar modulation method allows the phase modulated signal, which is input to the power amplifier 51, to be a constant envelope signal which has no fluctuation component in the amplitude direction. This allows the usage of a non-linearity amplifier operable at high efficiency as the power amplifier 51. On the other hand, it is required that a proportional relationship is established between a voltage value of the amplitude component signal and an output voltage of the power amplifier 51.

Also, an HBT (Hetero-junction Bipolar Transistor) device, which allows higher gain than an FET device and which can be readily miniaturized, is used as an element for use in the power amplifier 51. In the HBT device, however, a band offset occurs at an interface between dissimilar semiconductor layers being overlapped one on the other, and therefore there is a specific parameter called an amplitude offset voltage between the power supply voltage and the output voltage.

FIG. 16 is a diagram illustrating the amplitude offset voltage of the power amplifier 51. The horizontal axis in FIG. 16 indicates a power supply voltage Vcc of the power amplifier 51, and the vertical axis indicates an output voltage Vout of the power amplifier 51. As shown in FIG. 16, if the HBT device is used as the power amplifier 51, although the power supply voltage Vcc and the output voltage Vout change linearly, the line does not pass the origin, and therefore does not represent the proportional relationship. That is, the relationship between the power supply voltage Vcc and the output voltage Vout is non-linear near the origin. Unless an appropriate correction is made in the non-linear region, the relationship between the power supply voltage Vcc and the output voltage Vout deviates from its ideal characteristic, and the amount of the deviation appears as a distortion component. In this case, the problem is effects on an adjacent channel and a receive band, and these are strictly regulated by standard.

Due to the above-mentioned reason, the amplitude offset voltage needs to be considered in the case of using the HBT device as the power amplifier 51. The amplitude offset voltage is a power supply voltage Vcc at the time when the power amplifier 51 output rises. For example, the relationship between the power supply voltage Vcc and the output voltage Vout can be linear fit as shown in FIG. 16 to regard a voltage Vcos at a point of intersection between the linear line and the Vcc axis as the amplitude offset voltage. An adder 53 adds the amplitude offset voltage to the amplitude component signal, thereby avoiding the occurrence of distortion at the power amplifier 51.

In addition, it is assumed that an amplitude offset voltage, which is actually added to the amplitude component signal, is Vos, and an amplitude offset voltage that is optimum for the power amplifier 51 is Vamo. FIG. 17 is a diagram illustrating the optimal amplitude offset voltage Vamo. The definition of the optimal amplitude offset voltage Vamo can be determined arbitrary depending on the specification required for a system. Here, an amplitude offset voltage obtained when an Adjacent Channel Leakage Power Ratio (ACLR) is a minimum is defined as Vamo, as shown in FIG. 17. Alternatively, an amplitude offset voltage obtained when receive band noise or EVM (Error Vector Magnitude) is a minimum may be defined as Vamo.

It is known that there is strong correlation between the Vamo and the Vcos which are thus defined. Therefore, calculating and compensating for the Vcos of the power amplifier 51 allows suppression of the output signal distortion, and suppression of an adjacent channel leakage power ratio (ACLR) and the receive band noise within desired ranges, respectively.

CITATION LIST

Patent Literature

Patent Literature 1: U.S. Pat. No. 6,256,482

SUMMARY OF THE INVENTION

Problems to be Solved by the Invention

The relationship between the power supply voltage Vcc and the output voltage Vout of the power amplifier 51, however, varies depending on a characteristic, such as input power or operating temperature of the power amplifier 51, or variations among various power amplifiers, and according to this, the amplitude offset voltage Vcos of the power amplifier 51 also varies. Although a method, which stores all such characteristics in a ROM or the like and reads out the characteristic to compensate for the amplitude offset voltage Vcos (that is, compensation by an amplitude loop), may be possible, there is a problem that an increased memory usage leads to an increased cost. In addition, the compensation action by the amplitude loop as described above needs to be constantly executed, which causes other problems such as operation delay and increased power consumption.

Therefore, an object of the present invention is to provide a polar modulation apparatus which calculates the optimal amplitude offset voltage without the effect of variations among various power amplifiers or temperature change of a power amplifier, and compensates for output characteristics of the power amplifier.

Solution to the Problems

The present invention is directed to a polar modulation apparatus. In order to achieve the above object, the polar modulation apparatus of the present invention includes the following components: a data generator for generating, from a baseband signal, an amplitude component signal and a phase component signal; a phase modulator for generating a phase modulated signal obtained by phase modulating the phase component signal; an adder for adding an amplitude offset voltage to the amplitude component signal; a power amplifier, which includes a first hetero-junction bipolar transistor, for amplifying the phase modulated signal by using the amplitude component signal; a monitor unit for monitoring the power amplifier and outputting a monitor voltage; and a control unit for calculating the amplitude offset voltage according to the monitor voltage and outputting the calculated amplitude offset voltage to the adder. The monitor unit includes a second hetero-junction bipolar transistor and outputs a collector-emitter voltage of the second hetero-junction bipolar transistor as the monitor voltage.

According to this, the polar modulation apparatus is able to control output signal distortion by correcting the amplitude offset voltage of the power amplifier.

Furthermore, the first hetero-junction bipolar transistor and the second hetero-junction bipolar transistor are formed on the same semiconductor substrate. This allows the respective operating temperatures of the power amplifier and the monitor unit to be substantially the same, and therefore the offset voltage can be automatically adjusted according to change in temperature of the power amplifier.

Preferably, the second hetero-junction bipolar transistor has a smaller size than the first hetero-junction bipolar transistor. This allows reduction of power consumption of the monitor unit.

Furthermore, the monitor unit outputs, as the monitor voltage, a collector-emitter voltage which is obtained when a base current and a collector current of the second hetero-junction bipolar transistor are fixed to respective predetermined values.

The control unit calculates from the monitor voltage output by the monitor unit the amplitude offset voltage by an arithmetic operation using a predetermined linear function. This allows suppression of effect caused by variations among various power amplifiers.

Furthermore, parameters of the linear function are each selected so that the control unit outputs the amplitude offset voltage obtained when an adjacent channel leakage power ratio is a minimum. This allows suppression of the adjacent channel leakage power ratio (ACLR) within a desired range.

Furthermore, parameters of the linear function are each selected so that the control unit outputs the amplitude offset voltage obtained when receive band noise is a minimum. This allows suppression of the receive band noise within a desired range.

Furthermore, the polar modulation apparatus may further include an LUT having previously stored therein the amplitude offset voltage corresponding to the monitor voltage. In this case, the control unit refers to the LUT to calculate the amplitude offset voltage corresponding to the monitor voltage. This allows no need of arithmetic operation by the control unit, thereby reducing load on the control unit.

Furthermore, the polar modulation apparatus may further include a power supply control unit between the adder and the power amplifier, for amplifying, with a predetermined amplification factor G, the amplitude component signal to which the amplitude offset voltage is added. In this case, the control unit amplifies, with a predetermined amplification factor I/O, the amplitude offset voltage to be output to the adder. This allows the suppression of the output signal even when the power of the output signal is amplified.

Furthermore, the present invention also directed to a communication device including the above-described polar modulation apparatus. The communication device includes the following components: a transmission circuit for generating a transmission signal; and an antenna for outputting the transmission signal generated by the transmission circuit. The transmission circuit includes the above-described polar modulation apparatus. Alternatively, the communication device may further include: a reception circuit for processing a reception signal received from the antenna; and an antenna duplexer for outputting to the antenna the transmission signal generated by the transmission circuit and outputting to the reception circuit the reception signal received from the antenna.

Advantageous Effects of the Invention

As described above, according to the polar modulation apparatus of the present invention, the monitor unit uses the HBT for monitoring, which is disposed on the same substrate on which the HBT included in the power amplifier is disposed, to output, as a monitor voltage Vivos, a collector-emitter voltage VCE obtained when a base current IBB and a collector current IC are fixed to respective arbitrary values. Since the monitor voltage Vivos and an ideal amplitude offset voltage Vamo has strong correlation, the control unit is able to calculate from the monitor voltage Vivos an amplitude offset voltage Vos which is added to the amplitude component signal. This allows the suppression of the output signal distortion, and suppression of the adjacent channel leakage power ratio (ACLR) and the receive band noise within desired ranges, respectively. In addition, since the power amplifier and the monitor unit are formed on the same semiconductor substrate, the respective operating temperatures of the power amplifier and the monitor unit are substantially the same. Therefore, the amplitude offset voltage Vos (hence, the ideal amplitude offset voltage Vamo) can be automatically adjusted according to change in temperature of the power amplifier.

Moreover, according to the communication device of the present invention, using the above-described polar modulation apparatus allows the communication device to operate with low distortion and low noise over a wide range of output power.

BRIEF DESCRIPTION OF THE DRAWINGS

FIG. 1 is a block diagram showing an exemplary configuration of a polar modulation apparatus 1 according to a first embodiment of the present invention.

FIG. 11 is a diagram showing an example of what is stored in the LUT 17.

DESCRIPTION OF EMBODIMENTS

First Embodiment

Figure 2:
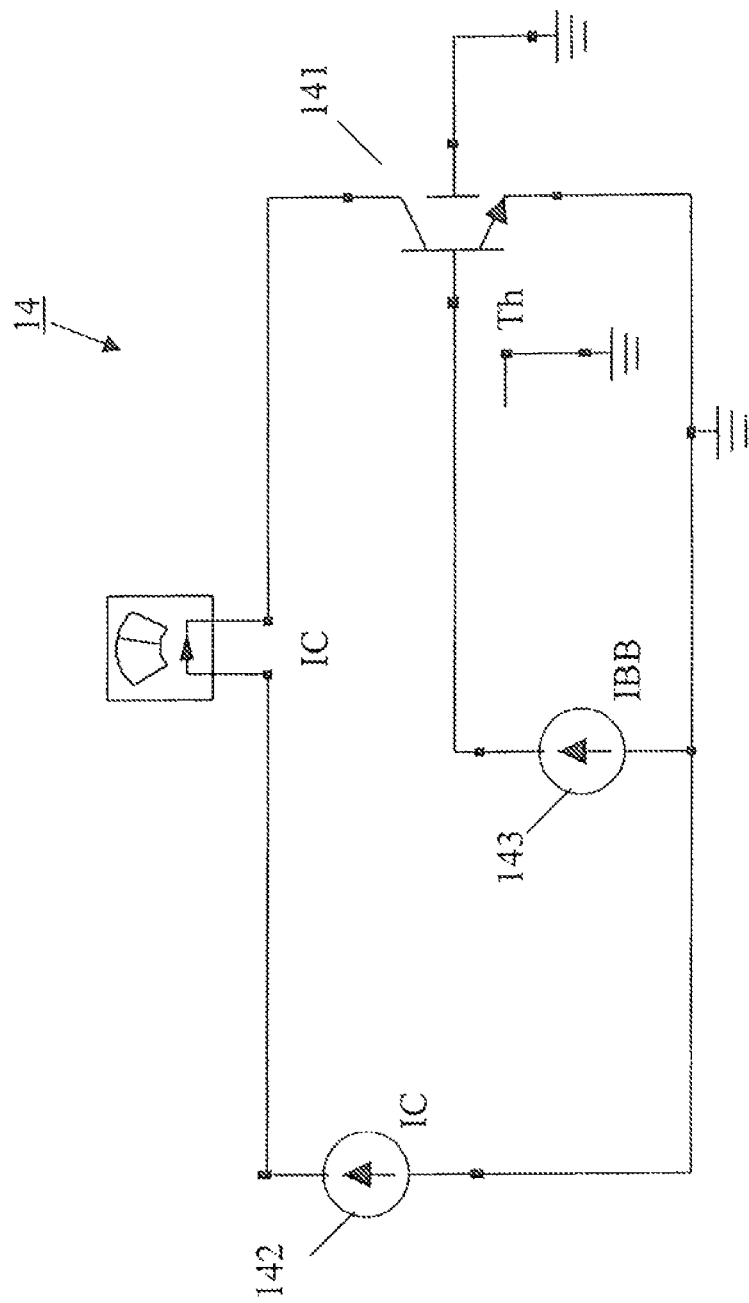
FIG. 2 is a circuit diagram showing an exemplary configuration of a monitor unit 14.

FIG. 1 is a block diagram illustrating an exemplary configuration of a polar modulation apparatus 1 according to a first embodiment of the present invention. In FIG. 1, the polar modulation apparatus 1 includes a data generator 11, a phase modulator 12, a power amplifier (PA) 13, a monitor unit 14, a control unit 15, and an adder 16. The data generator 11 generates, from a baseband signal, an amplitude component signal and a phase component signal. The phase modulator 12 generates a phase modulated signal obtained by phase modulating the phase component signal.

The phase modulated signal is input from the phase modulator 12 to the power amplifier 13. In addition, the amplitude component signal is supplied, as a power supply voltage, to the power amplifier 13 via the adder 16. The power amplifier 13 uses the amplitude component signal, which is supplied as the power supply voltage, to amplify the phase modulated signal. The power amplifier 13 includes an HBT (Heterojunction Bipolar Transistor).

The monitor unit 14 virtually monitors an amplitude offset voltage of the HBT of the power amplifier 13 and outputs a monitor voltage Vivos. A combination of the power amplifier 13 and the monitor unit 14 may be referred to as a PA module. Hereinafter, the monitor unit 14 is described in detail.

FIG. 2 is a circuit diagram showing an exemplary configuration of the monitor unit 14. Referring to FIG. 2, the monitor unit 14 includes a transistor 141, a current source 142, and a current source 143. The transistor 141 is an HBT (Heterojunction Bipolar Transistor). Preferably, the transistor 141 is formed on the same semiconductor substrate on which the transistor (HBT) included in the power amplifier 13 is formed so that the characteristic of the transistor 141 is approximate to that of the transistor included in the power amplifier 13. In addition, preferably, the transistor 141 has a smaller size than the transistor (HBT) included in the power amplifier 13 so that the power consumption is reduced. The current source 142 supplies the transistor 141 with a collector current IC. The current source 143 supplies the transistor 141 with a base current IBB.

Figure 3:
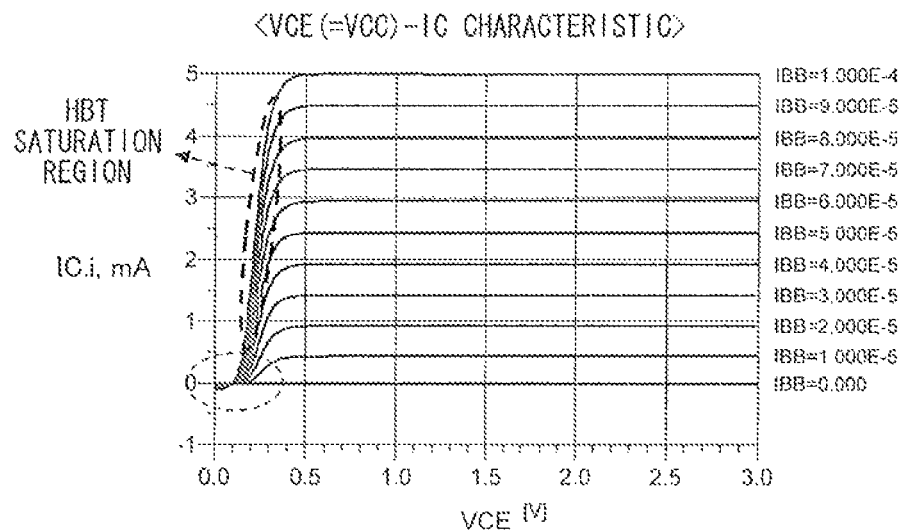
FIG. 3 is a diagram showing the VCE-IC characteristic of a transistor 141 included in the monitor unit 14.
Figure 4:
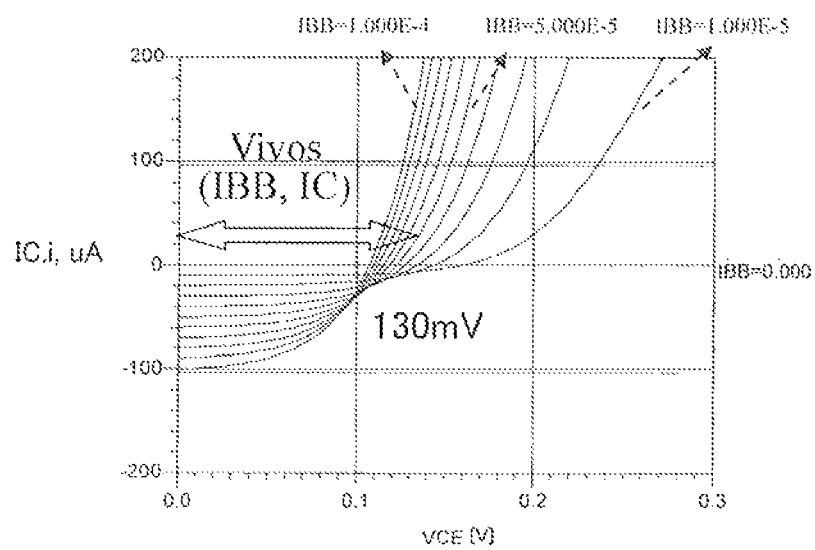
FIG. 4 is a diagram showing an enlarged region in which a collector current IC rises.

FIG. 3 is a diagram showing the VCE-IC characteristic of the transistor 141 included in the monitor unit 14. When the base current IBB is fixed to an arbitrary value by using the voltage source 142 and the current source 143 to change a collector-emitter voltage VCE, the collector current IC of the transistor 141 changes as shown in FIG. 3. Next, an enlarged region in which the collector current IC shown in FIG. 3 rises is shown in FIG. 4. It is seen in FIG. 4 that, if the base current IBB and the collector current IC are fixed to arbitrary values, respectively, the Vivos can be uniquely determined. That is, the monitor unit 14 outputs, as the monitor voltage Vivos, the collector-emitter voltage VCE obtained when the base current IBB and the collector current IC are fixed to arbitrary values, respectively.

Figure 5:
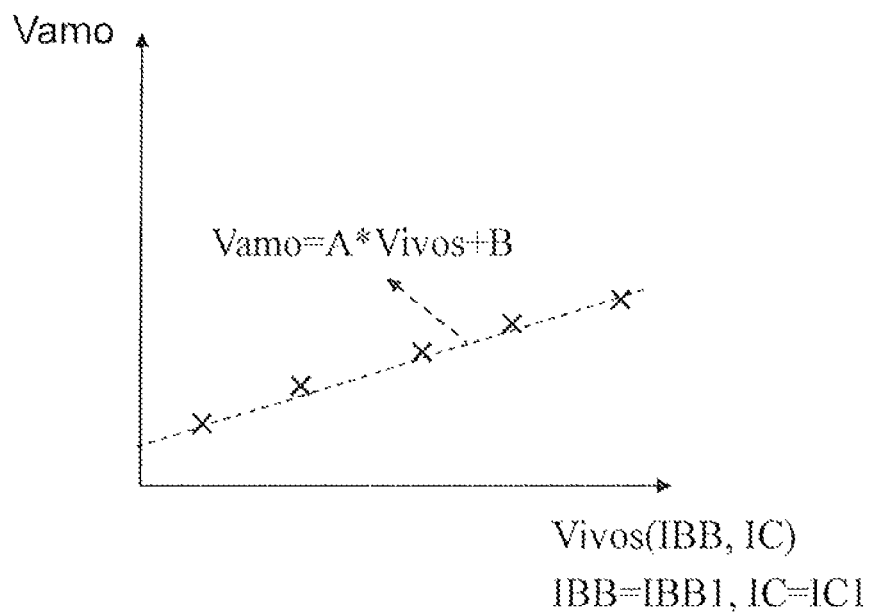
FIG. 5 is a diagram (IBB1, IC1) showing correlation between Vivos and Vamo.
Figure 6:
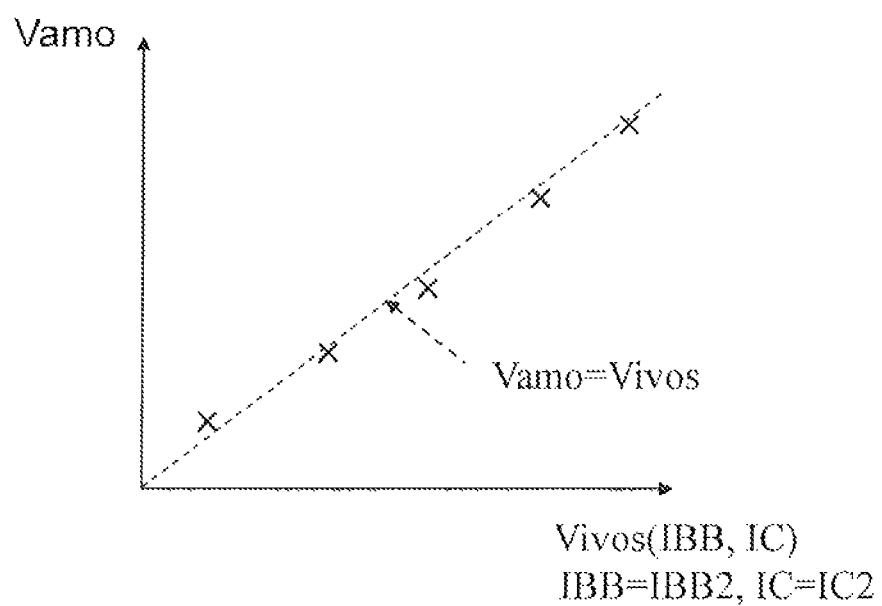
FIG. 6 is a diagram (IBB2, IC2) showing correlation between the Vivos and the Vamo.

FIG. 5 is a diagram showing correlation between the Vivos and the Vamo when the base current IBB and the collector current IC are fixed to IBB1 and IC1, respectively. FIG. 6 is a diagram showing correlation between the Vivos and the Vamo when the base current IBB and the collector current IC are fixed to IBB2 and IC2, respectively. The dots shown in FIG. 5 and FIG. 6 each show a plot of the Vivos versus the Vamo at the change of conditions, such as temperature of the power amplifier 13 or variations among the power amplifiers, with the respective values of the base current IBB and the collector current IC being fixed.

Figure 7:
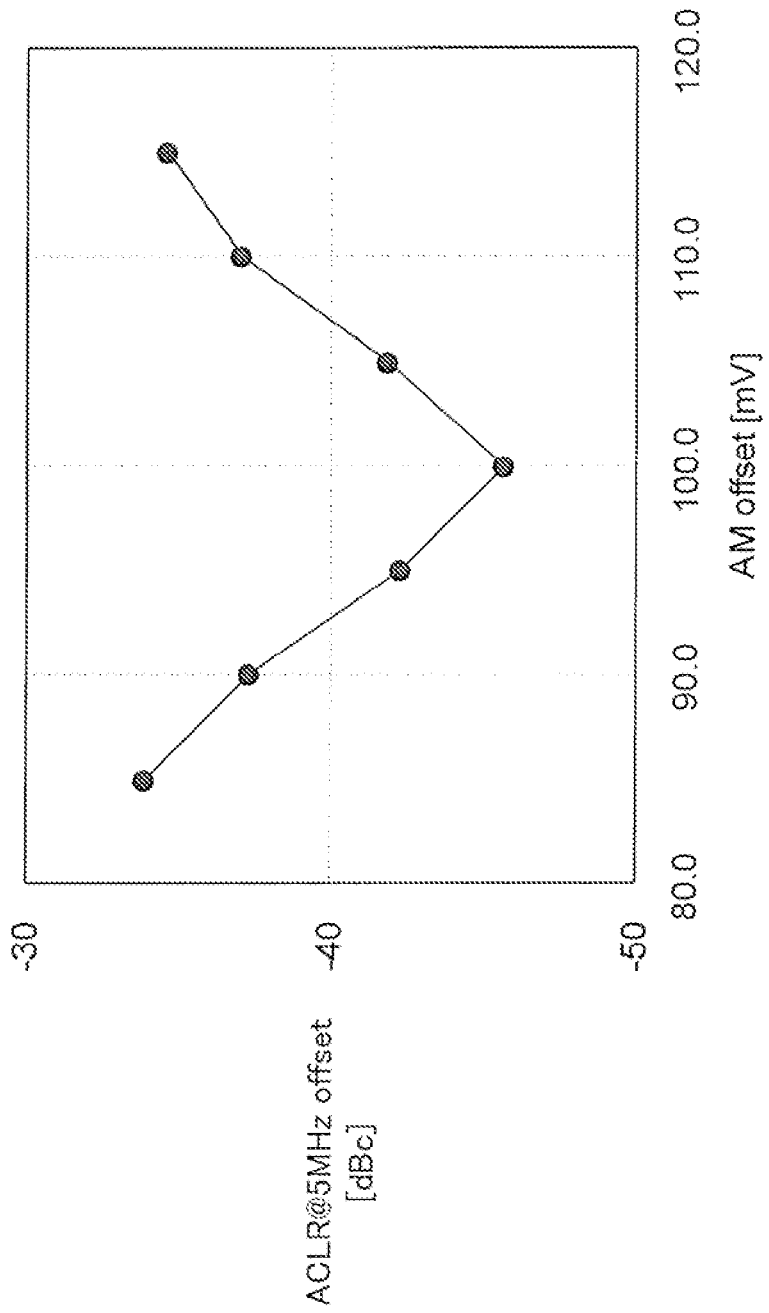
FIG. 7 is a diagram illustrating a typical Vamo.

Here, the Vamo is an amplitude offset voltage optimum for the power amplifier 13. The definition of optimal amplitude offset voltage Vamo can be determined arbitrary depending on the specification required for a system. FIG. 7 is a diagram illustrating a typical Vamo. The example shown in FIG. 7 represents ACLR (5 MHz detuning) when the polar modulation apparatus 1 is applied to an UMTS. As shown in FIG. 7, the amplitude offset voltage of the power amplifier 13 obtained when an adjacent channel leakage power ratio (ACLR) is a minimum, can be defined as the optimal offset voltage Vamo. Also, the amplitude offset voltage of the power amplifier 13 when receive band noise is a minimum may be defined as the optimal offset voltage Vamo. The amplitude offset voltage of the power amplifier 13 when the EVM is a minimum may also be defined as the optimal offset voltage Vamo.

Referring to FIG. 5, when the base current IBB and the collector current IC are fixed to IBB1 and IC1, respectively, the correlation between the Vivos and the Vamo can be represented by using a linear function (Equation 1) if, for example, each plot point is linear fit by the least squares method. IBB1 and IC1, however, are selected from arbitrary combinations thereof so that the relationship between the Vivos and the Vamo satisfies (Equation 1). Also, parameters A and B of the linear function represent arbitrary numeric values, respectively. The parameters A and B, however, are determined so that the ideal amplitude offset voltage Vamo can be calculated from the monitor voltage Vivos as a result of calculation using (Equation 1).

$$Vamo = A \cdot Vivos + B \quad \text{(Equation 1)}$$

Also, referring to FIG. 6, when the base current IBB and the collector current IC are fixed to IBB2 and IC2, respectively, the correlation between the Vivos and the Vamo can be represented by using (Equation 2) if, for example, each plot point is linear fit by the least squares method. That is, depending on how the base current IBB and the collector current IC are selected, the correlation between the Vivos and the Vamo can be set so as to satisfy a condition Vivos=Vamo. In this case, the polar modulation apparatus 1 no longer needs to adjust the monitor voltage Vivos, thus does not need to include the control unit 15. The equation representing the correlation between the Vamo and the Vivos is thus determined depending on the respective values of the base current IBB and the collector current IC.

$$Vamo = Vivos \quad \text{(Equation 2)}$$

The control unit 15 substitutes the monitor voltage Vivos calculated by the monitor unit 14 into a predetermined arithmetic expression to calculate an amplitude offset voltage Vos which is added to the amplitude component signal. For reasons mentioned above, the control unit 15 can use (Equation 3) or (Equation 4) as the predetermined arithmetic expression. The adder 16 adds the amplitude offset voltage Vos to the amplitude component signal to output a resulting amplitude component signal to the power amplifier 13.

$$Vos = A \cdot Vivos + B \quad \text{(Equation 3)}$$

$$Vos = Vivos \quad \text{(Equation 4)}$$

As described above, according to the polar modulation apparatus 1 of the first embodiment of the present invention, the monitor unit 14 uses the HBT for monitoring, which is disposed on the same substrate on which the HBT included in the power amplifier 13 is disposed, to output, as the monitor voltage Vivos, the collector-emitter voltage VCE which is obtained when the base current IBB and the collector current IC are fixed to the respective arbitrary values. Since the monitor voltage Vivos and the ideal amplitude offset voltage Vamo has strong correlation, the control unit 15 is able to calculate from the monitor voltage Vivos the amplitude offset voltage Vos which is added to the amplitude component signal. This allows the suppression of the output signal distortion, and the suppression of the adjacent channel leakage power ratio (ACLR) and the receive band noise within desired ranges, respectively. Also, since the power amplifier 13 and the monitor unit 14 are formed on the same semiconductor substrate, the respective operating temperatures of the power amplifier 13 and the monitor unit 14 are substantially the same. Therefore, the amplitude offset voltage Vos (hence, the ideal amplitude offset voltage Vamo) can be automatically adjusted according to change in temperature of the power amplifier 13.

Figure 8:
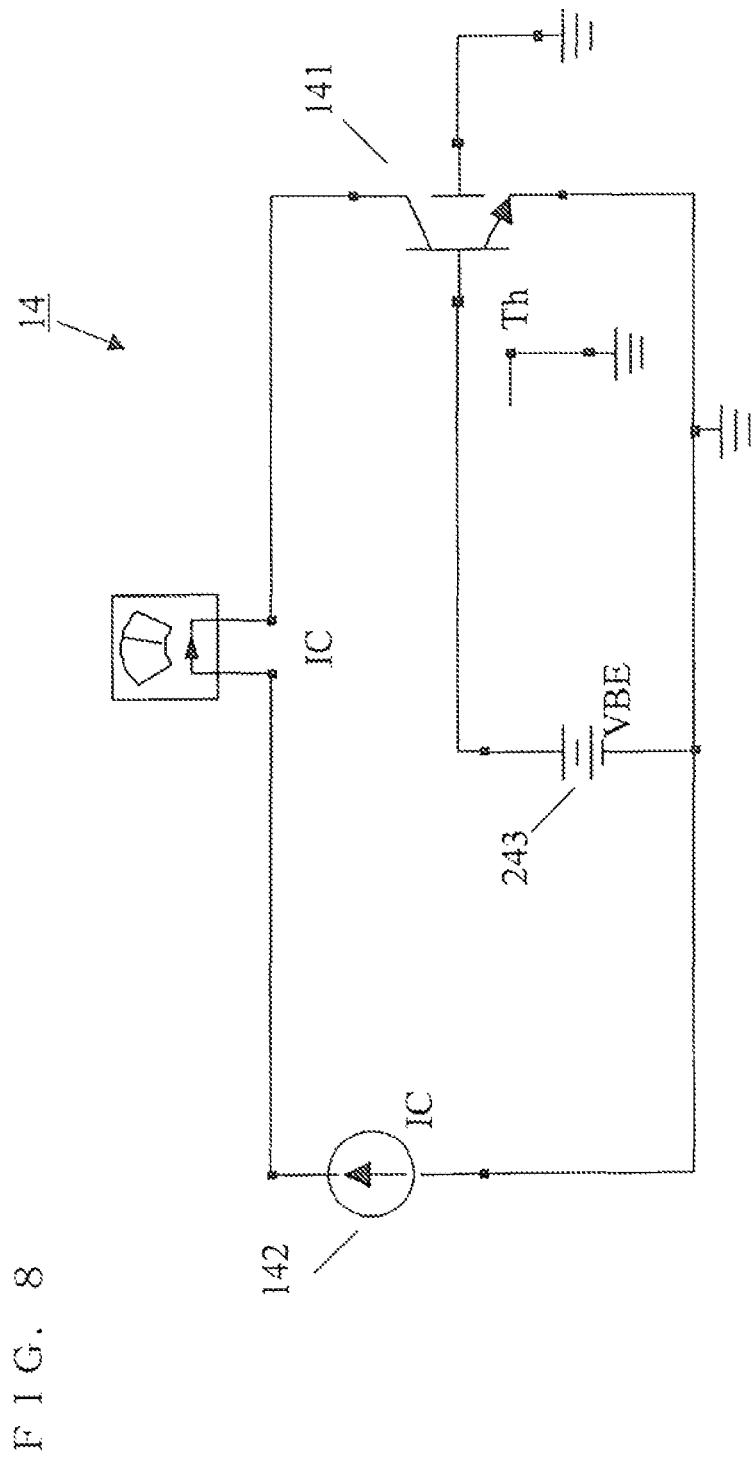
FIG. 8 is a circuit diagram showing an exemplary configuration of the monitor unit 14 including a voltage source 243.
Figure 9:
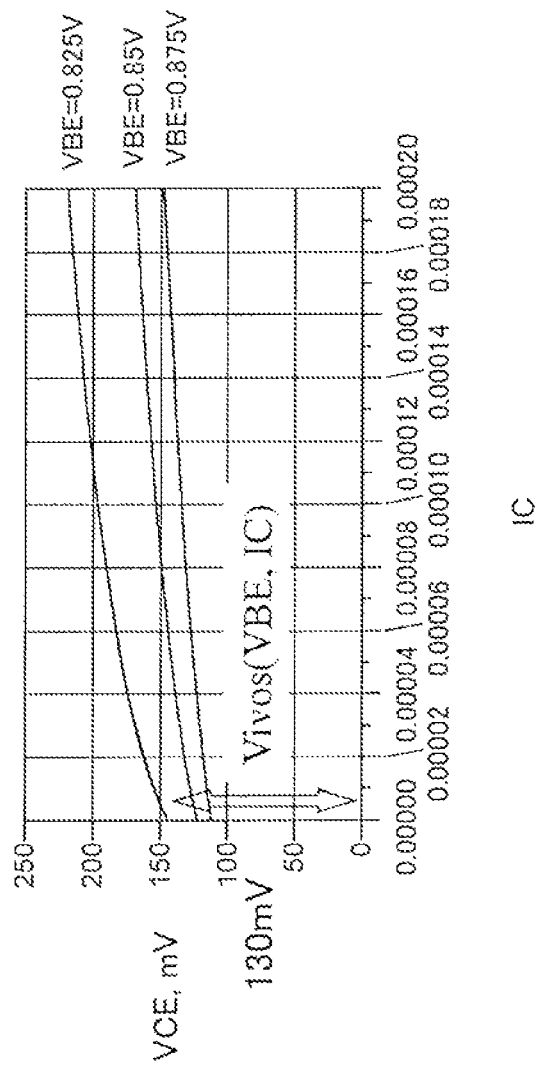
FIG. 9 is a diagram showing the IC-VCE characteristic of the transistor 141 included in the monitor unit 14.

The monitor unit 14 may include a voltage source 243 as shown in FIG. 8, instead of the current source 143. FIG. 8 is a circuit diagram showing an exemplary configuration of the monitor unit 14 including the voltage source 243. Referring to FIG. 8, the voltage source 243 supplies the transistor 141 with a base-emitter voltage VBE. FIG. 9 is a diagram showing the IC-VCE characteristic of the transistor 141 included in the monitor unit 14. When the base-emitter voltage VBE is fixed to an arbitrary value by the current source 142 and the voltage source 243 to change the collector current IC, the collector-emitter voltage VCE of the transistor 141 changes as shown in FIG. 9. Here, it is seen that, if the base-emitter voltage VBE and the collector current IC are fixed to arbitrary values, respectively, the Vivos can be uniquely determined.

Figure 10:
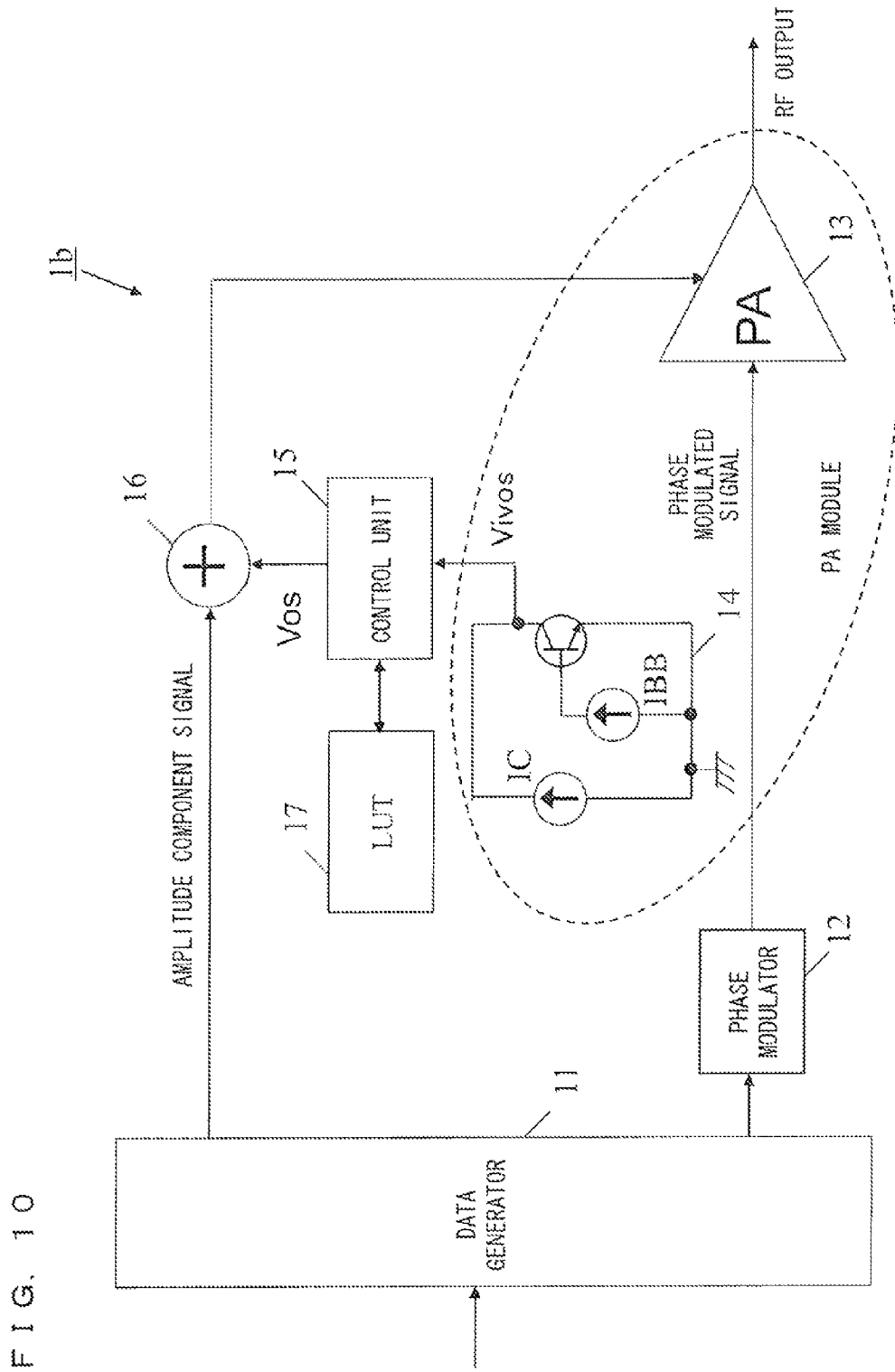
FIG. 10 is a block diagram showing an exemplary configuration of a polar modulation apparatus 1b including an LUT 17.

Furthermore, a polar modulation apparatus 1b may further include an LUT 17 as shown in FIG. 10. FIG. 10 is a block diagram showing an exemplary configuration of the polar modulation apparatus 1b including the LUT 17. It is assumed, as shown in FIG. 11, that the Vos, which correspond to the Vivos, are previously stored in the LUT 17. Referring to FIG. 10, the control unit 15 reads out from the LUT 17, the Vos, which corresponds to the Vivos, and outputs to the adder 16. Other configurations are the same as those of the polar modulation apparatus 1 shown in FIG. 1.

Figure 12:
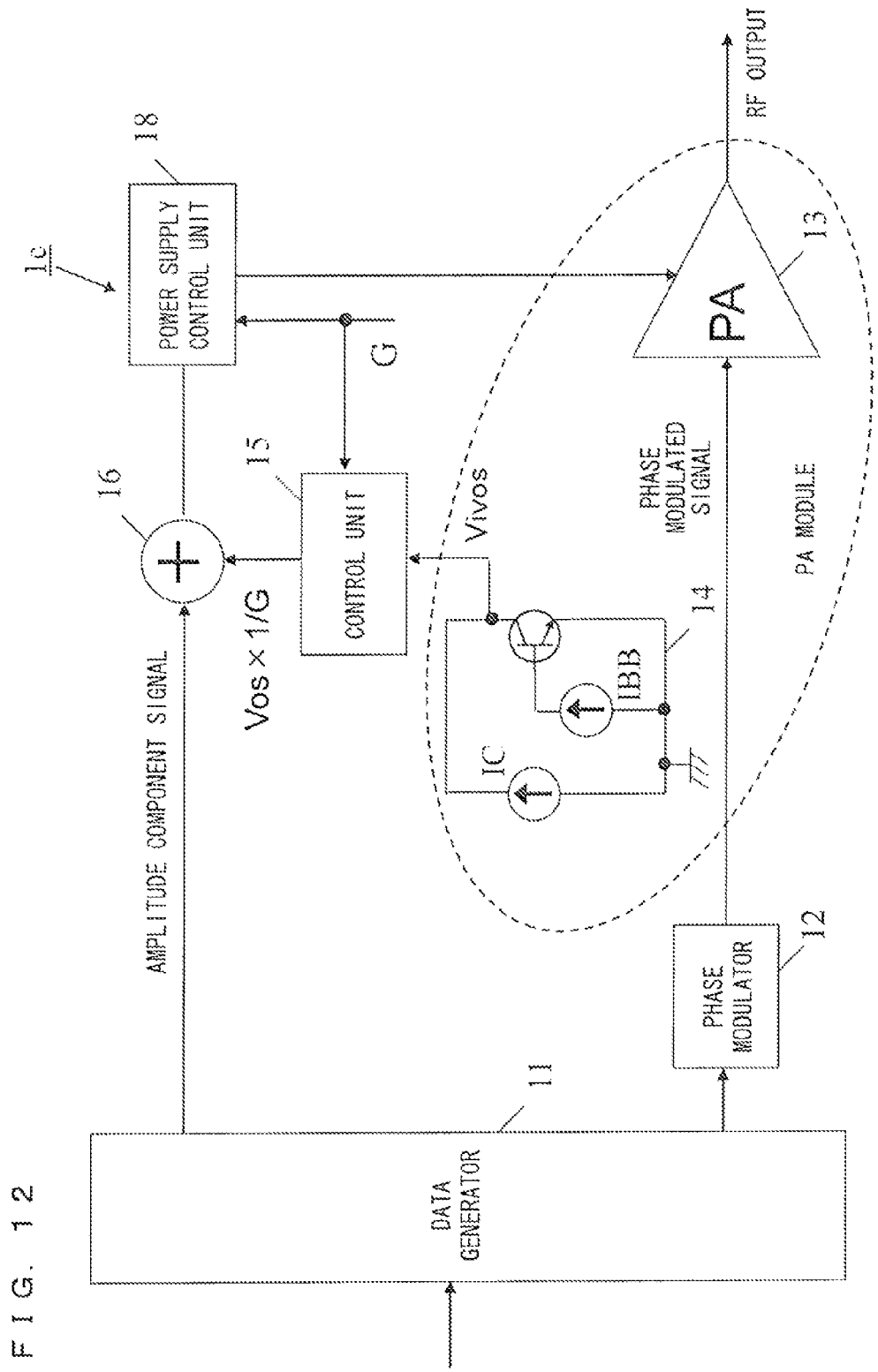
FIG. 12 is a block diagram showing an exemplary configuration of a polar modulation apparatus 1c including a power supply control unit 18.

Furthermore, a polar modulation apparatus 1c may further include a power supply control unit 18 between the adder 16 and the power amplifier 13, as shown in FIG. 12. FIG. 12 is a block diagram showing an exemplary configuration of the polar modulation apparatus 1c including the power supply control unit 18. Referring to FIG. 12, the power supply control unit 18 supplies to the power amplifier 13 an amplitude component signal amplified with an arbitrary gain G, as the power supply voltage. The control unit 15 outputs to the adder 16 the Vos amplified with an arbitrary gain 1/G. The reason for this is because the Vos added to the amplitude component signal is amplified by the power supply control unit 18, and therefore the Vos is previously attenuated before being amplified. Other configurations are the same as those of the polar modulation apparatus 1 shown in FIG. 1. By including the power supply control unit 18, the polar modulation apparatus 1c is able to output larger power.

Figure 13:
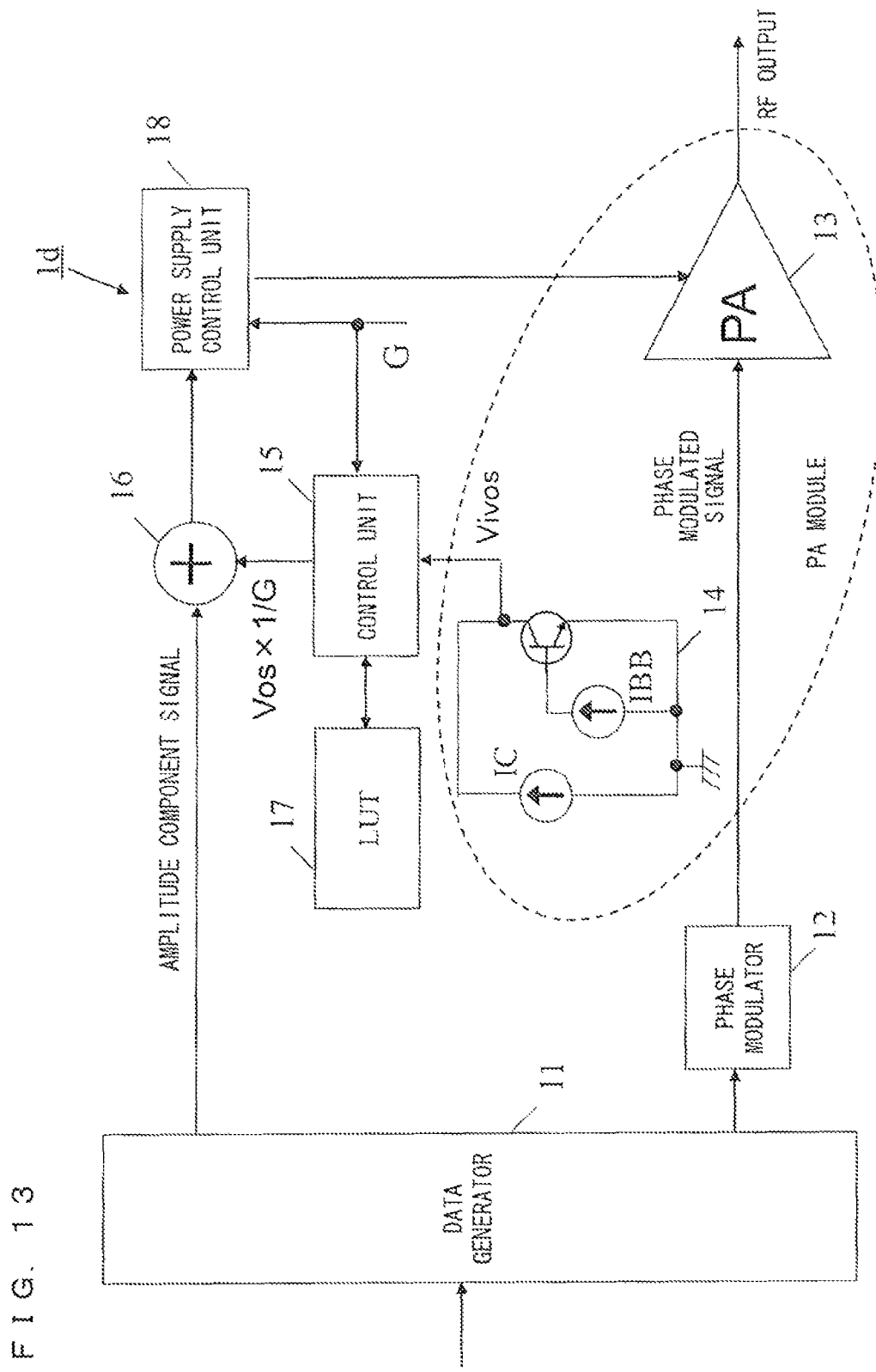
FIG. 13 is a block diagram showing an exemplary configuration of a polar modulation apparatus 1d including the LUT 17 and the power supply control unit 18.

A polar modulation apparatus 1d may further include the LUT 17 and the power supply control unit 18, as shown in FIG. 13. FIG. 13 is a block diagram showing an exemplary configuration of the polar modulation apparatus 1d including the LUT 17 and the power supply control unit 18. Referring to FIG. 13, the power supply control unit 18 supplies to the power amplifier 13 an amplitude component signal amplified with the arbitrary gain G, as the power supply voltage. As shown in FIG. 11, the LUT 17 previously stores therein the Vos which correspond to the Vivos. The control unit 15 reads out from the LUT 17 the Vos, which corresponds to the Vivos, and outputs to the adder 16 the Vos amplified with the arbitrary gain 1/G. Also, the polar modulation apparatus may include an LUT for every individual gain G. In this case, the control unit 15 reads out the Vos from an LUT corresponding to the gain G, and outputs to the adder 16 without performing calculation.

Second Embodiment

Figure 14:
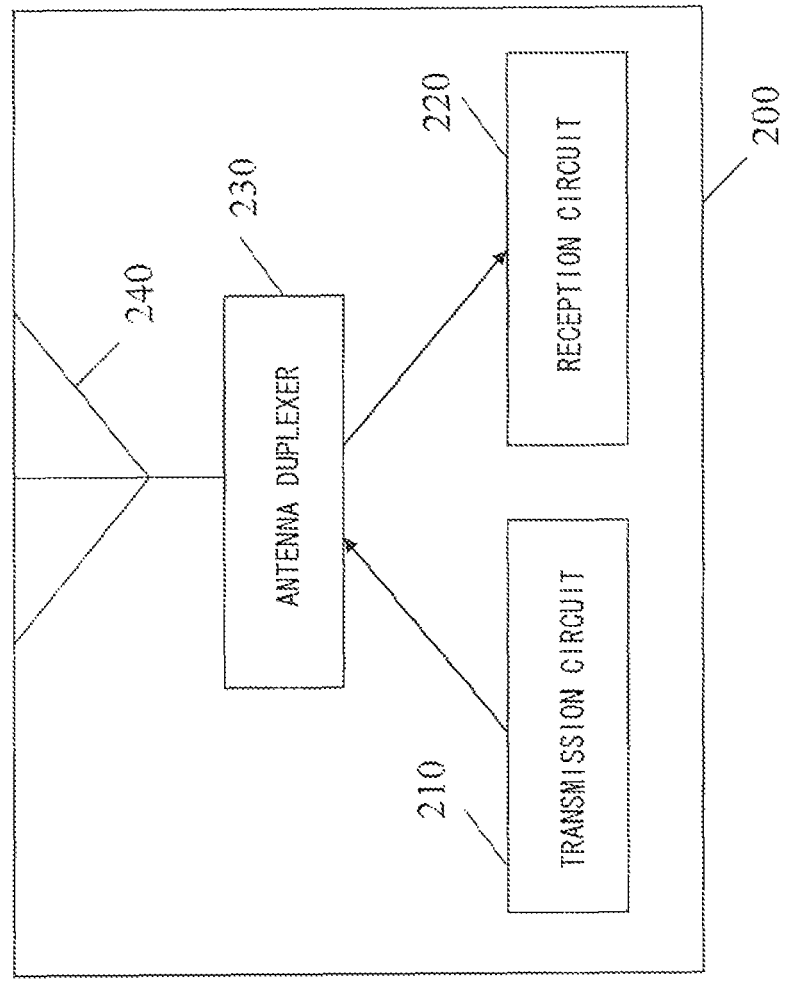
FIG. 14 is a block diagram showing an exemplary configuration of a communication device 200 according to a second embodiment of the present invention.
Figure 15:
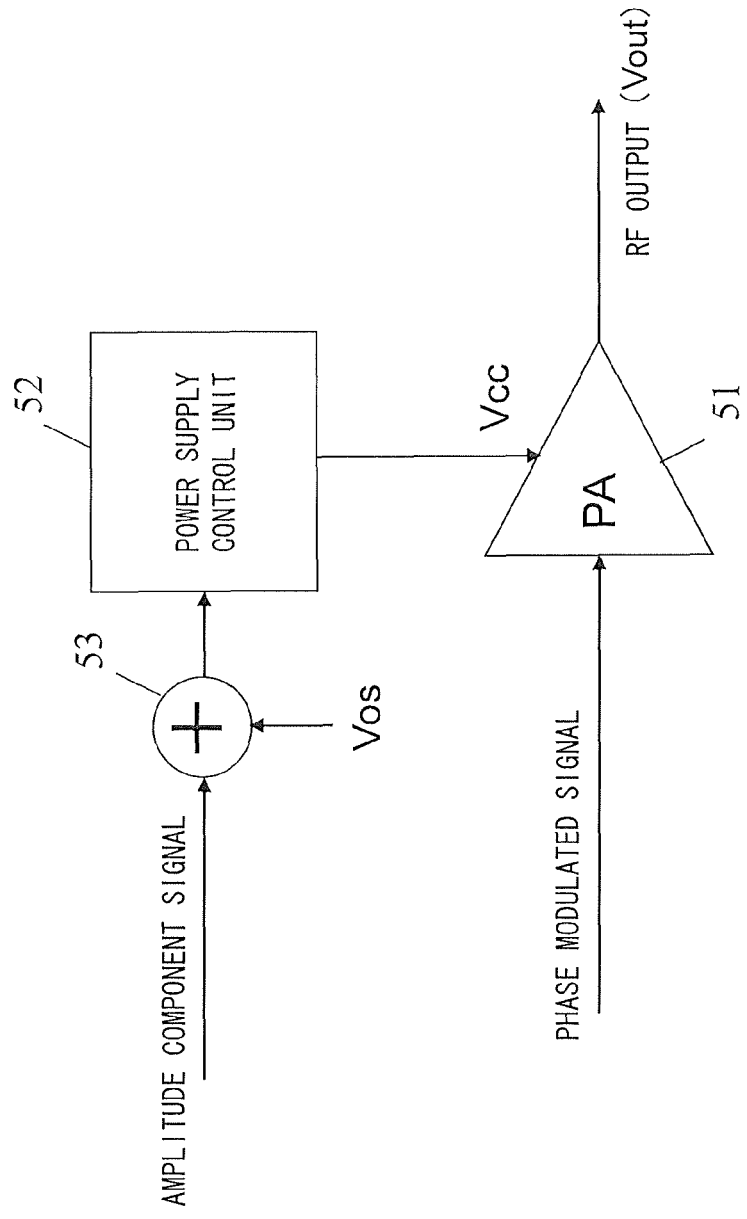
FIG. 15 is a diagram showing an exemplary configuration of a polar modulation apparatus using a conventional polar modulation method.
Figure 16:
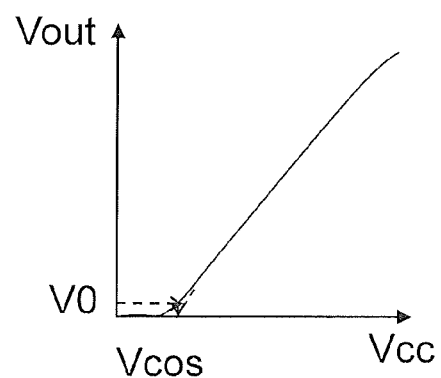
FIG. 16 is a diagram illustrating an amplitude offset voltage of a power amplifier 51.
Figure 17:
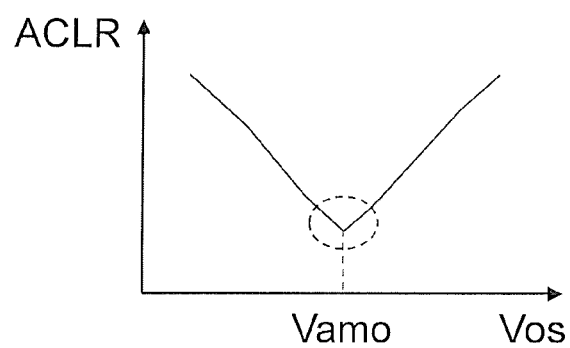
FIG. 17 is a diagram illustrating an optimal amplitude offset voltage Vamo.

FIG. 14 is a block diagram showing an exemplary configuration of a communication device 200 according to a second embodiment of the present invention. Referring to FIG. 14, the communication device 200 according to the second embodiment includes a transmission circuit 210, a reception circuit 220, an antenna duplexer 230, and an antenna 240. Any of the transmission circuits 1, 1b, 1c, and 1d according to the first embodiment is used as the transmission circuit 210. The antenna duplexer 230 transfers a transmission signal, which is output from the transmission circuit 210, to the antenna 240, and prevents leakage of the transmission signal to the reception circuit 220. The antenna duplexer 230 also transfers a reception signal, which is input thereto from the antenna 240, to the reception circuit 220, and prevents leakage of the reception signal to the transmission circuit 210.

As described above, the transmission signal is output from the transmission circuit 210 and emitted from the antenna 240 to the space via the antenna duplexer 230. The reception signal is received by the antenna 240, and received by the reception circuit 220 via the antenna duplexer 230. By employing the transmission circuit according to the first embodiment, the communication device 200 according to the second embodiment is able to achieve, as a wireless device, low distortion and low noise while retaining the linearity and low noise performance of the transmission signal. In addition, since there is no branching component, such as a directional coupler, for an output from the transmission circuit 210, the loss from the transmission circuit 210 to the antenna 240 can be reduced, thereby reducing the power consumption upon transmission and enabling the usage of the communication device 200 as a wireless communication device for extended period of time. The communication device 200 may include the transmission circuit 210 and the antenna 240 only.

INDUSTRIAL APPLICABILITY

A polar modulation apparatus according to the present invention is applicable to communication devices such as mobile phones and wireless LAN devices.

DESCRIPTION OF THE REFERENCE CHARACTERS 1, 1b, 1c, 1d polar modulation apparatus
11 data generator
12 phase modulator
13 power amplifier
14 monitor unit
15 control unit
16 adder
17 LUT
18 power supply control unit
141 transistor
142, 143 current source
243 voltage source
51 power amplifier
52 power supply control unit
53 adder
200 communication device
210 transmission circuit
220 reception circuit
230 antenna duplexer
240 antenna

The invention claimed is:

1. A polar modulation apparatus comprising:
a data generator for generating, from a baseband signal, an amplitude component signal and a phase component signal;
a phase modulator for generating a phase modulated signal obtained by phase modulating the phase component signal;
an adder for adding an amplitude offset voltage to the amplitude component signal;
a power amplifier, which includes a first hetero-junction bipolar transistor, for amplifying the phase modulated signal by using the amplitude component signal;
a monitor unit for monitoring the power amplifier and outputting a monitor voltage; and
a control unit for calculating the amplitude offset voltage according to the monitor voltage and outputting the calculated amplitude offset voltage to the adder, wherein
the monitor unit includes a second hetero-junction bipolar transistor and outputs, as the monitor voltage, a collector-emitter voltage which is obtained when a base current and a collector current of the second hetero-junction bipolar transistor are fixed to respective predetermined values.

2. The polar modulation apparatus according to claim 1, wherein the first hetero-junction bipolar transistor and the second hetero-junction bipolar transistor are formed on the same semiconductor substrate.

3. The polar modulation apparatus according to claim 1, wherein the second hetero-junction bipolar transistor has a smaller size than the first hetero-junction bipolar transistor.

4. The polar modulation apparatus according to claim 1, wherein the control unit calculates from the monitor voltage output by the monitor unit the amplitude offset voltage by an arithmetic operation using a predetermined linear function.

5. The polar modulation apparatus according to claim 4, wherein parameters of the linear function are each selected so that the control unit outputs the amplitude offset voltage obtained when an adjacent channel leakage power ratio is a minimum.

6. The polar modulation apparatus according to claim 4, wherein parameters of the linear function are each selected so that the control unit outputs the amplitude offset voltage obtained when receive band noise is a minimum.

7. The polar modulation apparatus according to claim 1, further comprising
an LUT having previously stored therein the amplitude offset voltage corresponding to the monitor voltage, wherein
the control unit refers to the LUT to calculate the amplitude offset voltage corresponding to the monitor voltage.

8. The polar modulation apparatus according to claim 1, further comprising
a power supply control unit between the adder and the power amplifier, for amplifying, with a predetermined amplification factor G, the amplitude component signal to which the amplitude offset voltage is added, wherein
the control unit amplifies, with a predetermined amplification factor 1/G, the amplitude offset voltage to be output to the adder.

9. A communication device comprising:
a transmission circuit for generating a transmission signal; and
an antenna for outputting the transmission signal generated by the transmission circuit, wherein
the transmission circuit includes the polar modulation apparatus according to claim 1.

10. The communication device according to claim 9, further comprising:
a reception circuit for processing a reception signal received from the antenna; and
an antenna duplexer for outputting to the antenna the transmission signal generated by the transmission circuit and outputting to the reception circuit the reception signal received from the antenna.

11. A polar modulation apparatus comprising:
a data generator for generating, from a baseband signal, an amplitude component signal and a phase component signal;
a phase modulator for generating a phase modulated signal obtained by phase modulating the phase component signal;
an adder for adding an amplitude offset voltage to the amplitude component signal;
a power amplifier, which includes a first hetero-junction bipolar transistor, for amplifying the phase modulated signal by using the amplitude component signal;
a monitor unit for monitoring the power amplifier and outputting a monitor voltage; and
a control unit for calculating the amplitude offset voltage according to the monitor voltage and outputting the calculated amplitude offset voltage to the adder, wherein
the monitor unit includes a second hetero-junction bipolar transistor and outputs, as the monitor voltage, a collector-emitter voltage which is obtained when a base voltage and a collector current of the second hetero-junction bipolar transistor are fixed to respective predetermined values.

* * * * *